United States Patent
Knapp

(10) Patent No.: US 10,903,815 B2
(45) Date of Patent: Jan. 26, 2021

(54) ACOUSTIC WAVE RESONATOR AND ELECTRONIC FILTER CIRCUIT

(71) Applicant: Fraunhofer-Gesellschaft zur Förderung der angewandten Forschung e.V., Munich (DE)

(72) Inventor: Marius Knapp, Freiburg (DE)

(73) Assignee: FRAUNHOFER-GESELLSCHAFT ZUR FÖRDERUNG DER ANGEWANDTEN FORSCHUNG E.V., Munich (DE)

(*) Notice: Subject to any disclaimer, the term of this patent is extended or adjusted under 35 U.S.C. 154(b) by 0 days.

(21) Appl. No.: 16/398,843

(22) Filed: Apr. 30, 2019

(65) Prior Publication Data
US 2019/0356300 A1    Nov. 21, 2019

(30) Foreign Application Priority Data

May 18, 2018  (DE) .................... 10 2018 207 825

(51) Int. Cl.
  *H03H 9/02*   (2006.01)
  *H03H 9/17*   (2006.01)
  *H03H 9/56*   (2006.01)
  *H03H 9/13*   (2006.01)

(52) U.S. Cl.
  CPC ........ *H03H 9/131* (2013.01); *H03H 9/02031* (2013.01); *H03H 9/132* (2013.01); *H03H 9/175* (2013.01); *H03H 9/176* (2013.01); *H03H 9/562* (2013.01); *H03H 9/564* (2013.01)

(58) Field of Classification Search
  CPC ............... H03H 9/02; H03H 9/17; H03H 9/56
  USPC ................................. 333/187–189, 191, 193
  See application file for complete search history.

(56) References Cited

U.S. PATENT DOCUMENTS

| 9,590,163 | B2 | 3/2017 | Schmidhammer et al. |
| 2002/0043888 | A1* | 4/2002 | Aigner ............... H03H 9/02228 310/313 B |
| 2013/0342079 | A1 | 12/2013 | Schmidhammer et al. |
| 2014/0292153 | A1* | 10/2014 | Sinha .................... H03H 9/175 310/346 |
| 2017/0298523 | A1 | 10/2017 | Hoffmann et al. |

FOREIGN PATENT DOCUMENTS

DE  10 2016 202 202 B4  12/2017

OTHER PUBLICATIONS

Zhenyun Qian et al., "Graphene as a Massless Electrode for Ultrahigh-Frequency Piezoelectric Nanoelectromechanical Systems," Nanoletters, dated Jun. 1, 2015, pp. A-F (4599-5604), vol. 15, No. 7, published online by American Chemical Society at URL https://pubs.acs.org/doi/10.1021/acs.nanolett.5b01208.

(Continued)

*Primary Examiner* — Dean O Takaoka
(74) *Attorney, Agent, or Firm* — Brinks Gilson & Lione

(57) ABSTRACT

An acoustic wave resonator may be provided comprising a main body, which contains or consists of a piezoelectric material, and at least one electrode, which is arranged on the main body and covers at least a portion of the main body and which contains graphene, wherein the graphene of the electrode is provided with a metal coating, which is a partial coating of the graphene. An electronic filter circuit with such an acoustic wave resonator may also be provide.

16 Claims, 3 Drawing Sheets

(56) References Cited

OTHER PUBLICATIONS

Marius Knapp et al., "Wettability Investigations and Wet Transfer Enhancement of Large-Area CVD-Graphene on Aluminum Nitride," Nanomaterials 2017, dated Aug. 18, 2017, pp. 1-14, vol. 7, No. 226, published MDPI AG, Basel, Switzerland.

Marius Knapp et al., "Graphene as an Active Virtually Massless Top Electrode for RF Solidly Mounted Bulk Acoustic Wave (SMR-BAW) Resonators," Nanotechnology, dated Feb. 1, 2018, pp. 1-10, vol. 29, No. 10, published by IOP Publishing Limited, Bristol, UK.

Joshua T. Smith, "Reducing Contact Resistance in Graphene Devices through Contact Area Patterning," ACS Nano, DOI: 10.1021/22400671z, dated Mar. 8, 2013, pp. 3661-3667, vol. 7, No. 4, published online by American Chemical Society at URL https://pubs.acs.org/doi/10.1021/nn400671z.

Steven Mahon et al., "Bulk Acoustic Wave Devices—Why, How, and Where They are Going," dated May 14, 2007, pp. 15-18, published by CS Mantech Conference, Austin, TX.

Z. Qian et al., "245 MHZ Graphene-Aluminum Nitride Nano Plate Resonator," 2013 Transducers & Eurosensors XXVII: The $17^{th}$ International Conference on Solid-State Sensors, Actuators and Microsystems, ISBN 978-1-4673-5983-2, dated Jun. 16, 2013, pp. 2005-2008, published by IEEE, Barcelona, Spain.

\* cited by examiner

ACOUSTIC WAVE RESONATOR AND ELECTRONIC FILTER CIRCUIT

CROSS-REFERENCE TO RELATED APPLICATIONS

This application claims priority under 35 U.S.C. § 119 to German Patent Application No. DE 10 2018 207 825.4, filed May 18, 2018, which is hereby incorporated by reference.

TECHNICAL FIELD

The invention relates to an acoustic wave resonator with a main body which contains or consists of a piezoelectric material and with at least one electrode which contains graphene and which is arranged on the main body and covers at least a portion of the main body. The invention also relates to an electronic filter circuit with such an acoustic wave resonator. Acoustic wave resonators of the type mentioned above can be used, for example, as a component of filter circuits in the high-frequency technology.

BRIEF DESCRIPTION OF THE DRAWINGS

The embodiments may be better understood with reference to the following drawings and description. The components in the figures are not necessarily to scale.

DETAILED DESCRIPTION

Figure 1:
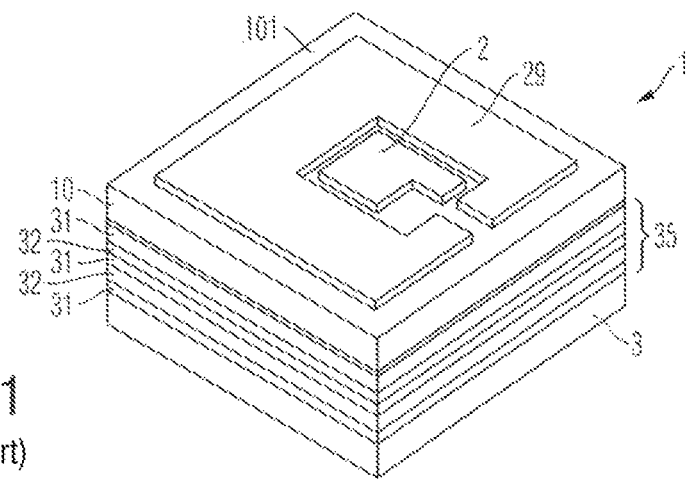
FIG. 1 shows a known acoustic wave resonator.

It is known from US 2013/342079 A1 that a piezoelectric material is deposited on a structured metallic electrode. A graphene electrode is applied to the piezoelectric material. When an electric voltage is applied to both electrodes, an electric field is generated in the piezoelectric material. If the applied voltage is an alternating voltage, the piezoelectric material can be excited to vibrate. Such components can thus be used as filter elements for frequencies between 0.2 GHz and 2.6 GHz.

This known resonator has the disadvantage that graphene has a specific sheet resistance of 31Ω. Thus the sheet resistance of the graphene electrode is considerably higher than that of a metal layer. For example, a copper layer with a thickness of 35 μm merely has a specific sheet resistance of 0.5 mΩ. In practice, it has therefore been shown that the graphene electrode cannot homogeneously distribute the introduced current over the surface. This can adversely affect the coupling factor of the resonator. However, a metal electrode adds additional mass to the piezoelectric material, which adversely affects the resonance frequency.

Therefore, the object of the invention is to provide resonators for high-frequency filters, which have an increased resonance frequency compared to known resonators while simultaneously improving the quality factor and the coupling factor.

The invention proposes an acoustic wave resonator with a main body. The main body contains or consists of a piezoelectric material. During operation of the resonator, a surface wave can be excited on the main body in some embodiments of the invention. In other embodiments of the invention, the entire volume or a partial volume of the main body can be made to vibrate.

At least one electrode is arranged on the main body. The electrode covers at least a portion of the main body. An electric field can be generated in the piezoelectric material by means of the at least one electrode. Such an alternating electric field leads to forced vibrations of the piezoelectric material. The acoustic wave resonator proposed according to the invention thus represents a microelectromechanical component.

In some embodiments of the invention, at least two electrodes can be arranged on a surface of the main body, each covering a portion of this surface. In other embodiments of the invention, electrodes can be arranged on opposite surfaces of the main body.

According to the invention, at least one electrode contains graphene. In the sense of the present description, graphene is a modification of carbon with a two-dimensional structure in which each carbon atom is surrounded by three further carbon atoms at an angle of 120°. In some embodiments of the invention, the electrode contains exactly one atomic layer of graphene. In other embodiments of the invention, a plurality of graphene layers can be arranged in at least partially overlapping fashion on the main body. Due to the low density and the low absolute mass of the graphene, such an electrode adds only little additional mass to the main body, so that the resonance frequency is not or only slightly impaired.

The graphene can be obtained mechanically or electrochemically by splitting graphite. In other embodiments of the invention, graphene can be produced by reducing graphene oxide. In yet other embodiments of the invention, graphene can grow epitaxially on metallic substrates from where it can be transferred to the main body of the acoustic wave resonator.

In order to distribute the electric current flowing during the operation of the acoustic wave resonator homogeneously over the electrode, the graphene of the electrode is additionally provided with a metal coating. This metal coating is designed as a partial coating according to the invention. On the one hand, the metal coating can thus reduce the electrical resistance in the plane of the graphene and contribute to the homogeneous distribution of the electric current. On the other hand, the partial coating saves additional mass so that a negative influence on the resonance frequency of the acoustic wave resonator is avoided. At the same time, the resonator quality increases compared to known, full-surface metal coatings and the coupling factor is higher than with known electrodes, which consist exclusively of graphene.

In some embodiments of the invention, the metal coating can be arranged at least partially over the part of the main body which is set into mechanical vibrations during the operation of the acoustic wave resonator. In some embodiments of the invention, the metal coating can have a structuring with at least one finger, which has a greater length than width in the plane of the electrode. In other embodiments of the invention, the metal coating can have a net- or grating-like structuring. In some embodiments of the invention, the metal coating can have between 2 and 20 fingers or grating bars. In other embodiments of the invention, there can be between 2 and 10 fingers or grating bars. In yet other embodiments of the invention, there can be several electrodes, each of which has a plurality of fingers, the fingers of one electrode engaging in the interspaces of the other electrode. In some embodiments of the invention, the metal coating can be produced with a CVD or a PVD process. Due to the high electrical conductivity of the metal or alloy, such metal coatings are suitable for homogenizing and distributing the electric current on the graphene. At the same time, only small masses are additionally deposited on the resonator due to the structuring of the metal coating.

In some embodiments of the invention, the width of at least one finger of the metal coating can be less than about 6 μm or less than about 3 μm. Such narrow fingers have a higher electrical resistance due to their smaller cross-section. Completely surprisingly, however, it was recognized that this is sufficient to homogenize the current flow across the electrode and that the resonator quality and the coupling factor further increase in the case of smaller widths of the finger-shaped metal coating. At the same time, the occurrence of secondary resonances is avoided or at least reduced by narrower structures of the metal coating, so that such a component according to the invention is easier to use in filter circuits or such a filter circuit has a higher quality.

In some embodiments of the invention, the metal coating can have a thickness of about 5 nm to about 500 nm or about 30 nm to about 300 nm or about 50 nm to about 250 nm.

In some embodiments of the invention, the metal coating is designed in such a way that the ratio of the sum of the length of all edges of the metal coating to the total area of the metal coating is greater than about 0.3 $\mu m/\mu m^2$ or greater than about 0.5 $\mu m/\mu m^2$ or greater than about 0.8 $\mu m/\mu m^2$ or greater than about 1 $\mu m/\mu m^2$ or greater than about 1.3 $\mu m/\mu m^2$ or greater than about 1.5 $\mu m/\mu m^2$. It has been shown that the transfer of the electric current between the metal coating and the graphene occurs primarily via the edges of the metal coating. A comparatively large edge length in relation to the total area of the metal coating therefore has a positive effect on the coupling factor.

In some embodiments of the invention, the main body can contain or consist of a group III nitride.

In some embodiments of the invention, the main body can contain or consist of AlN or AlScN. All these materials are piezoelectric and have a high breakdown field strength due to their large band gap, so that the acoustic wave resonator can be reliably operated even with small geometric dimensions and the resulting large field strengths in the main body.

In some embodiments of the invention, the acoustic wave resonator according to the invention can have a quality factor of more than about 550 or more than about 600 or more than about 700 or more than about 750 or more than about 800 or more than about 1000 or more than about 1400. In the present description, the quality factor is a measure of the damping or energy loss of the resonator. In this context, high quality means that the resonator according to the invention is weakly damped.

In some embodiments of the invention, the electrode can have a width and/or a length of about 100 μm to about 500 μm or of about 150 μm to about 400 μm or of about 180 μm to about 300 μm.

In some embodiments of the invention, the metal coating can be structured in such a way that no periodicities occur. This prevents or at least reduces the occurrence of secondary resonances.

In some embodiments of the invention, the metal coating can contain titanium and/or gold and/or molybdenum and/or tungsten. Such a coating can be an alloy containing both titanium and gold. In other embodiments of the invention, the metal coating can be a titanium layer coated with gold and/or tungsten and/or molybdenum. In yet other embodiments of the invention, either titanium or gold or molybdenum or tungsten can be used. In other embodiments of the invention, the metal coating can alternatively or additionally contain or consist of Al and/or Ru and/or Ag and/or Cu. Such layers can be easily deposited, for example by thermal evaporation or sputtering. In addition, such a metal coating can be easily structured, for example by masking with a photoresist, subsequent structuring and wet or dry chemical etching.

The invention will be explained in more detail below by means of drawings without limiting the general inventive concept, wherein FIG. 1 shows a known acoustic wave resonator.

Figure 2:
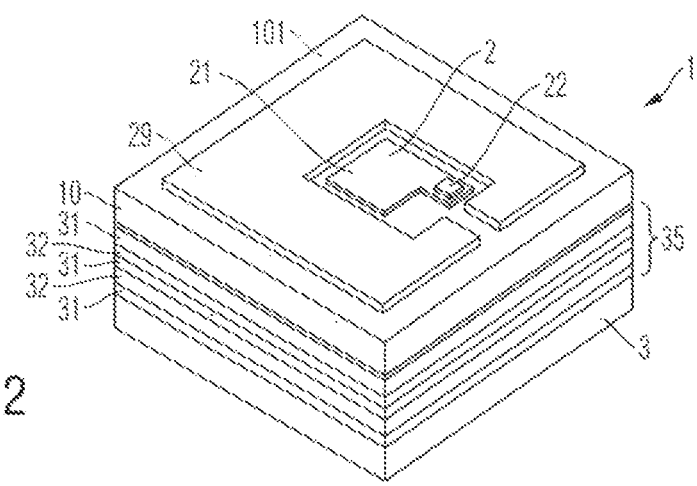
FIG. 2 shows an acoustic wave resonator according to a first embodiment of the invention.

FIG. 2 shows an acoustic wave resonator according to a first embodiment of the invention.

Figure 3:
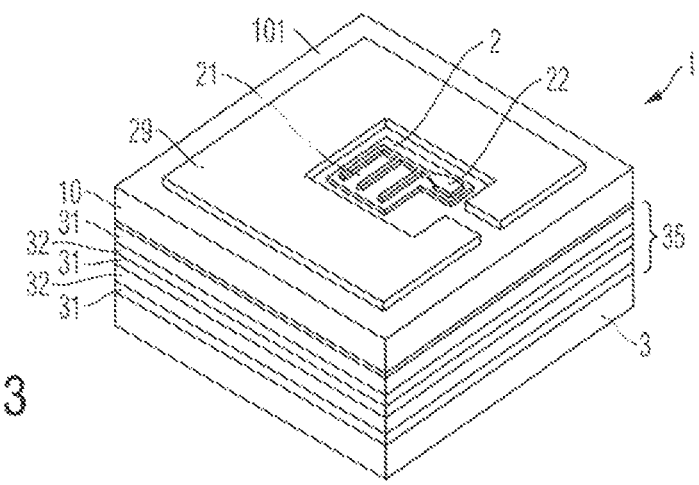
FIG. 3 shows an acoustic wave resonator according to a second embodiment of the invention.

FIG. 3 shows an acoustic wave resonator according to a second embodiment of the invention.

Figure 4:
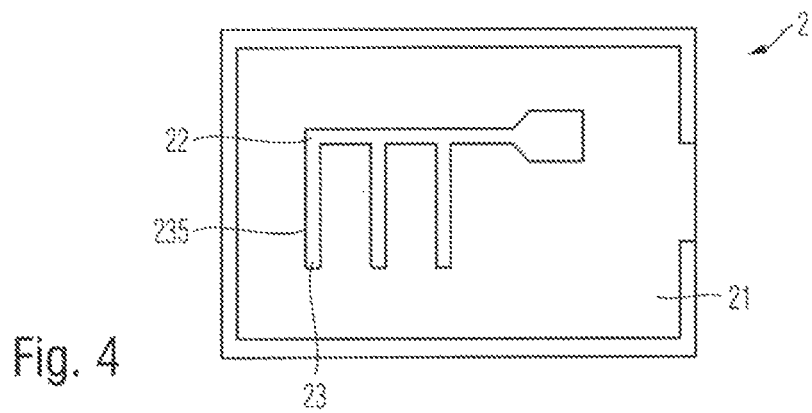
FIG. 4 shows an embodiment of an electrode in a first design.

FIG. 4 shows an embodiment of an electrode in a first design.

Figure 5:
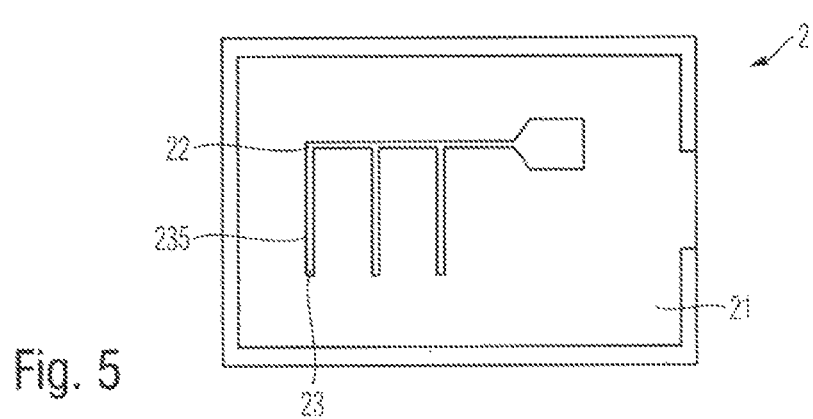
FIG. 5 shows an embodiment of an electrode in a second design.

FIG. 5 shows an embodiment of an electrode in a second design.

Figure 6:
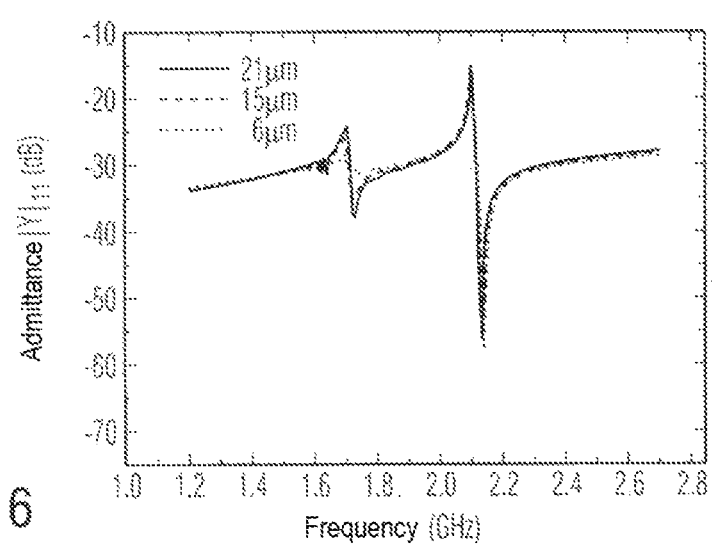
FIG. 6 shows the admittance against the frequency for different structure widths of the metal coating.

FIG. 6 shows the admittance against the frequency for different structure widths of the metal coating.

Figure 7:
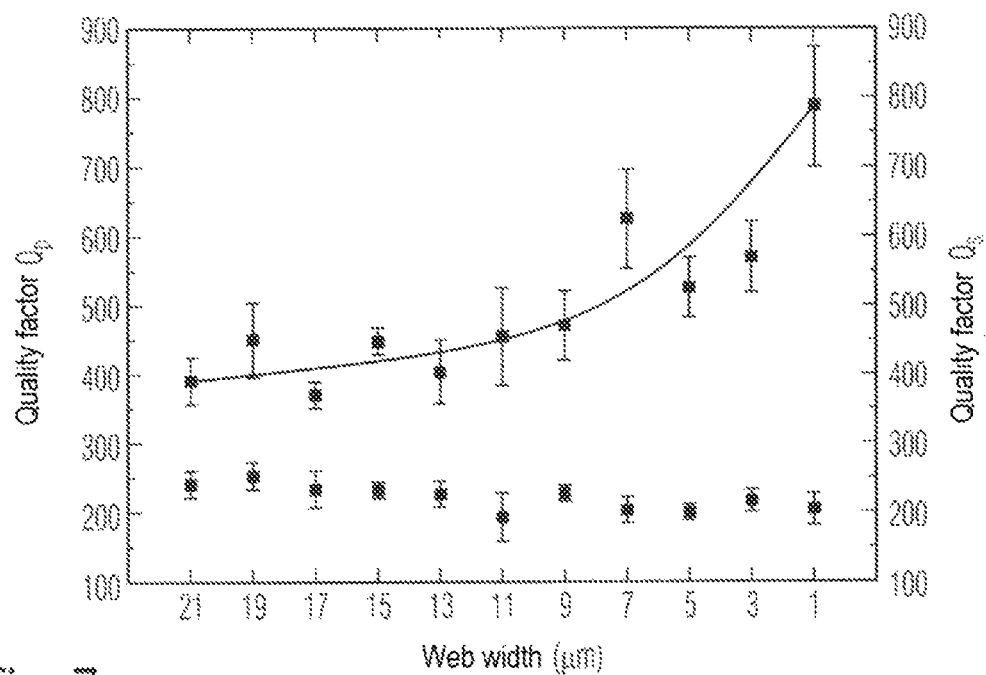
FIG. 7 shows the quality factor of the acoustic wave resonator against the structure width of the metal coating.

FIG. 7 shows the quality factor of the acoustic wave resonator against the structure width of the metal coating.

Figure 8:
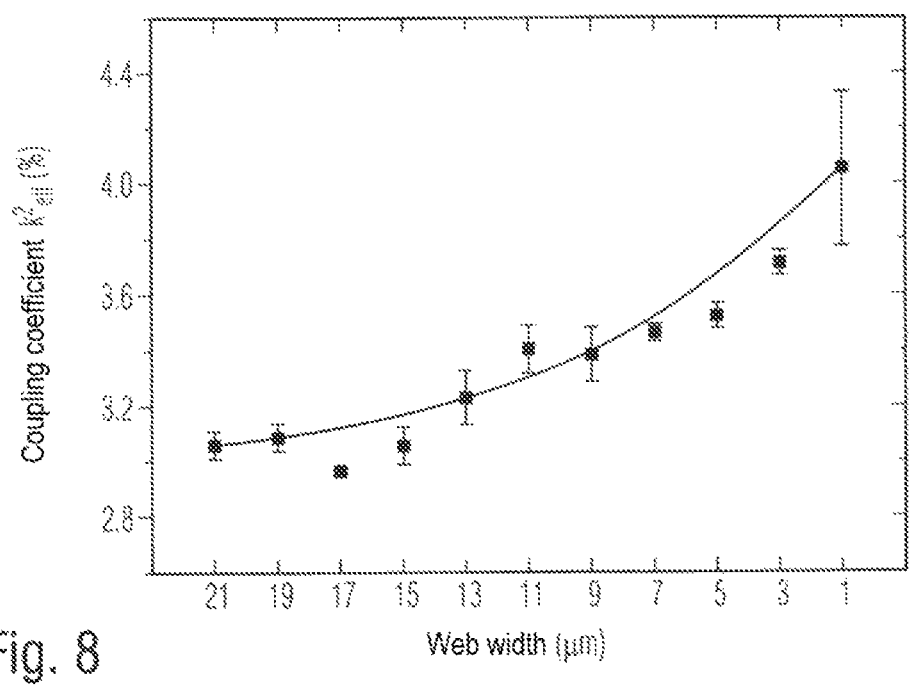
FIG. 8 shows the coupling coefficient against the structure width of the metal coating.

FIG. 8 shows the coupling coefficient against the structure width of the metal coating.

FIG. 1 shows an acoustic wave resonator 1 according to the prior art. The acoustic wave resonator 1 has a main body 10. The main body 10 can contain or consist of a piezoelectric material, such as AlN or AlScN. In other embodiments of the invention, another binary, ternary or quaternary compound can also be used. Such a compound can contain or consist of a group III nitride.

The main body has a first side 101 and an opposite second side. The second side of the main body 10 is arranged on a Bragg reflector 35. The Bragg reflector 35 contains a plurality of individual layers 31 and 32. In the illustrated embodiment, five individual layers 31 and 32 are shown. A person skilled in the art is, of course, aware that the number of individual layers can also be larger or smaller. In some embodiments of the invention, the Bragg reflector 35 can also be omitted. In addition, the individual layers 31 and/or 32 can also be used to compensate or minimize a grating mismatch of the main body 10 to the underlying substrate 3. In some embodiments of the invention, the Bragg reflector and/or the individual layers 31 and 32 can also be omitted.

The acoustic wave resonator 1 is arranged with the Bragg reflector 35 and the main body 10 on a substrate 3. For example, substrate 3 can contain or consist of silicon or silicon carbide. The substrate 3 can be larger than the main body 10 or, as in the illustrated embodiment, can have approximately the same size.

The main body 10 can have a width of about 50 μm to about 500 μm and/or a length of about 50 μm to about 500 μm and/or a thickness of about 70 nm to about 3600 nm and/or a thickness of about 100 nm to about 5000 nm.

On the first side 101 of the main body 10, a first electrode 2 and a second electrode 29 are arranged. The electrodes contain a metal or an alloy or consist of a metal or an alloy. During the operation of the acoustic wave resonator, an alternating voltage is applied to both electrodes and can induce a mechanical vibration of the main body 10 depending on the applied frequency. This vibration can be a volume vibration of the main body 10. The excited vibration can be the first transversal electrical mode of the main body 10. The maximum total impedance of the acoustic wave resonator or the minimum admittance results at the resonance frequency of the main body. In this case, part of the supplied electrical energy is converted into mechanical vibration energy. The acoustic wave resonator according to the invention can thus also be described as a microelectromechanical component.

A disadvantage of the component shown in FIG. 1 is the large mass of electrode 2, which shifts the resonance frequency to lower values and/or deteriorates the quality factor of the resonator. Based on the resonator shown in FIG. 1, the object of the invention is therefore to provide a resonator with a higher resonance frequency and/or higher quality and/or higher coupling factor. The invention proposes to design at least one electrode 2 in such a way that it contains graphene 21, which is provided with a metal coating 22, which is realized as a partial coating of the graphene 21.

FIG. 2 shows a first embodiment of the invention. The same components of the invention are provided with the same reference signs, so that the following description is limited to the essential differences. As can be seen from FIG. 2, the first electrode 2 is a graphene layer on the first side 101 of the main body 10. The graphene can, for example, be separated from the gas phase or produced by splitting highly oriented graphite. Subsequently, the graphene 21 can be applied to the first side 101 of the main body 10, for example by bonding and/or wet transfer. Since graphene has a much lower density and a much lower thickness than the metal electrodes according to the prior art, the additional mass applied to the main body 10 is reduced by the electrode 2, so that the resonance frequency increases compared to the use of a metal electrode. Graphene in the sense of the present description refers to an atomically thin layer of carbon in which each carbon atom is bonded to an adjacent carbon atom at a bonding angle of 120°.

For contacting the graphene 21, a metal coating 22 is available, which is designed as a partial coating of the graphene. In the first embodiment of the invention that is shown in FIG. 2, the metal coating 22 is only disposed in the edge area of electrode 2, so that the applied additional mass is minimal due to the electrode 2.

A second embodiment of the invention is explained by means of FIG. 3. In this case, too, equal components of the invention are provided with equal reference signs, so that the following description is limited to the essential differences. As can be seen from FIG. 2, the metal coating 22 has a structuring with at least one finger, which has a greater length than width in the plane of electrode 2. In the illustrated embodiment, the structuring has three fingers. In other embodiments of the invention, the number of fingers may be greater or also smaller. The invention does not teach the use of exactly three fingers as a solution principle.

FIGS. 4 and 5 show an electrode 2 in detail. The electrode 2 has a graphene layer 21, which at least partially covers the first side 101 of the main body 10. The metal coating 22 is arranged on the graphene 21. In the illustrated embodiment, the metal coating 22 has three fingers 23, which has a comparatively small width of less than about 6 μm or less than about 3 μm, for example. In some embodiments of the invention, the width is greater than about 0.5 μm. In addition, the fingers 23 have a comparatively large length, which for example is more than 50 μm, more than 100 μm or more than 150 μm. In some embodiments of the invention, the length is less than about 200 μm.

FIGS. 4 and 5 show that the metal coating is structured in such a way that it has about three fingers. In other embodiments of the invention, the number of fingers can be greater or smaller.

The metal coating 22 has a circumferential edge 235 which limits the metal coating against the surrounding graphene. The ratio of the sum of the length of all edges of the metal coating can be greater than about 0.3 μm/μm$^2$ or greater than about 0.5 μm/μm$^2$ or greater than about 0.8 μm/μm$^2$ or greater than about 1 μm/μm$^2$ or greater than about 1.3 μm/μm$^2$ or greater than about 1.5 μm/μm$^2$. As shown in FIGS. 4 and 5, the ratio of the sum of the lengths of all edges of the metal coating to the total area of the metal coating increases when the fingers 23 are thinner. The metal coating with a smaller total area that is shown in FIG. 5 applies less additional mass to electrode 2 and can thus contribute to an increase in the quality factor and/or resonance frequency. Since the charge transfer between the metal coating 22 and the graphene 21 takes place predominantly via the edges 235 of the metal coating 22, the coupling factor can also be favorably influenced.

FIG. 6 shows the admittance against the frequency for the component geometry shown in FIG. 3 according to the second embodiment of the invention.

Shown is the frequency range from 1.2 to 2.6 GHz on the abscissa and the admittance in dB on the ordinate for a metal coating with three different widths of the three fingers each. Measured values for a width of 21 μm, 15 μm and 6 μm are shown. As shown in FIG. 6, the acoustic wave resonator has a main resonance at about 2.1 GHz and a secondary resonance at 1.74 GHz. This secondary resonance can be particularly disturbing for cascading a plurality of resonators in an electronic filter circuit. As can be seen from FIG. 6, the secondary resonance is excited less strongly or not at all if the width of the fingers is less than about 6 μm.

FIG. 7 shows the quality factor on the ordinate against the width of the fingers on the abscissa for the second embodiment of the invention that is shown in FIG. 3. A value range from 1 μm to 21 μm is shown in steps of 2 μm. Thus, 11 resonators were examined, which all have the geometry shown in FIG. 3, but each have different widths of the fingers of the metal coating. The quality factor $Q_p$ of the parallel resonance is shown. This is the working point of the resonator, at which the admittance becomes a minimum and part of the electrical energy is converted into vibration energy. Here, the main body 10 vibrates mechanically in the first transversal electrical mode. As is shown in FIG. 7, the quality factor rises sharply at structure widths below about 6 μm, i.e. the damping of the resonator decreases.

The quality factor $Q_s$ is plotted on the right ordinate. It remains approximately unaffected. This so-called series resonance occurs at a frequency at which the total impedance has a minimum or the admittance shows its maximum. At this frequency, the main body 10 does not vibrate mechanically, which is why a dependence on the mass of electrode 2 is not observed.

FIG. 8 shows the coupling efficiency against the width of the fingers 23 for the second embodiment of the invention that is shown in FIG. 3. A value range from 1 μm to 21 μm is shown in steps of 2 μm. Thus, 11 resonators were examined, which all have the geometry shown in FIG. 3, but each of which has different widths of the fingers of the metal coating. The coupling efficiency also increases with decreasing width or increasing ratio of the sum of the length of all edges of the metal coating to the total area of the metal coating. The increase occurs exponentially with the decrease of the width of the fingers 23, so that the quality of the acoustic wave resonator according to the present invention increases with decreasing width of the fingers 23 of the metal coating 22.

Of course, the invention is not limited to the illustrated embodiments. Therefore, the above description should not be regarded as restrictive but as explanatory. The following claims are to be understood in such a way that a stated feature is present in at least one embodiment of the invention. This does not exclude the presence of further features. If the claims and the above description define "first" and "second" embodiments, this designation is used to distinguish between two similar embodiments without determining a ranking order.

To clarify the use of and to hereby provide notice to the public, the phrases "at least one of <A>, <B>, . . . and <N>" or "at least one of <A>, <B>, . . . <N>, or combinations thereof" or "<A>, <B>, . . . and/or <N>" are defined by the Applicant in the broadest sense, superseding any other implied definitions hereinbefore or hereinafter unless expressly asserted by the Applicant to the contrary, to mean one or more elements selected from the group comprising A, B, . . . and N. In other words, the phrases mean any combination of one or more of the elements A, B, . . . or N including any one element alone or the one element in combination with one or more of the other elements which may also include, in combination, additional elements not listed. Unless otherwise indicated or the context suggests otherwise, as used herein, "a" or "an" means "at least one" or "one or more."

The research work that led to this patent application was funded by the European Union under the Horizon 2020 Program, under Agreement No. 649953.

The invention claimed is:

1. An acoustic wave resonator comprising:
   a main body, which contains or consists of a piezoelectric material, said main body having a first side and an opposite second side; and
   at least one first electrode, being arranged directly on the first side of the main body and covering at least a portion of the main body and comprising graphene, wherein a metal coating is arranged on the graphene of the electrode, and wherein the metal coating is a partial coating of the graphene.

2. The acoustic wave resonator of claim 1, wherein the metal coating has a structuring with at least one finger, which has a greater length than width in a plane of the electrode.

3. The acoustic wave resonator of claim 2, wherein the width of at least one finger is less than about 6 μm.

4. The acoustic wave resonator of claim 2, wherein the width of at least one finger is less than about 3 μm.

5. The acoustic wave resonator of claim 1, wherein the ratio of the sum of the length of all edges of the metal coating to the total area of the metal coating is greater than about 0.3 μm·μm$^{-2}$.

6. The acoustic wave resonator of claim 1, wherein the ratio of the sum of the length of all edges of the metal coating to the total area of the metal coating is greater than about 1.5 μm·μm$^{-2}$.

7. The acoustic wave resonator of claim 1, wherein the main body contains or consists of a group III nitride.

8. The acoustic wave resonator of claim 1, wherein the main body contains or consists of AlN or AlScN.

9. The acoustic wave resonator of claim 1, wherein the acoustic wave resonator has a quality factor greater than about 550.

10. The acoustic wave resonator of claim 1, wherein acoustic wave resonator has a quality factor greater than about 800.

11. The acoustic wave resonator of claim 1, wherein the electrode has a width and/or a length of about 100 μm to about 500 μm.

12. The acoustic wave resonator of claim 1, wherein the electrode has a width and/or a length of about 180 μm to about 300 μm.

13. The acoustic wave resonator of claim 1, wherein the metal coating is structured in such a way that no periodicities occur.

14. The acoustic wave resonator of claim 1, wherein the metal coating contains or consists of titanium, gold, molybdenum, and/or tungsten.

15. The acoustic wave resonator of claim 1, wherein the acoustic wave resonator is included in an electronic filter circuit.

16. The acoustic wave resonator of claim 1, wherein the metal coating is a partial coating of a surface of the graphene that is opposite of the first side of the main body.

* * * * *